(12) United States Patent
Suzuki et al.

(10) Patent No.: US 10,545,378 B2
(45) Date of Patent: Jan. 28, 2020

(54) ELECTRO-OPTICAL SWITCHING ELEMENT AND DISPLAY DEVICE

(71) Applicant: Merck Patent GmbH, Darmstadt (DE)

(72) Inventors: Masayoshi Suzuki, Tokyo (JP); Tadashi Kishimoto, Kanagawa (JP)

(73) Assignee: Merck Patent GmbH, Darmstadt (DE)

( * ) Notice: Subject to any disclaimer, the term of this patent is extended or adjusted under 35 U.S.C. 154(b) by 120 days.

(21) Appl. No.: 15/548,428

(22) PCT Filed: Jan. 20, 2016

(86) PCT No.: PCT/EP2016/000093
§ 371 (c)(1),
(2) Date: Aug. 3, 2017

(87) PCT Pub. No.: WO2016/124312
PCT Pub. Date: Aug. 11, 2016

(65) Prior Publication Data
US 2018/0024404 A1 Jan. 25, 2018

(30) Foreign Application Priority Data

Feb. 4, 2015 (EP) .................................. 15000327

(51) Int. Cl.
*G02F 1/1335* (2006.01)
*G02F 1/13357* (2006.01)

(52) U.S. Cl.
CPC .. *G02F 1/133617* (2013.01); *G02F 1/133504* (2013.01); *G02F 1/133514* (2013.01); *G02F 2001/133614* (2013.01)

(58) Field of Classification Search
CPC ......... G02F 1/133602; G02F 1/133609; G02F 1/133617; G02F 2001/133614; G02F 1/133504; G02F 1/133514; H01L 27/322; H01L 51/5268; H01L 2251/5361
See application file for complete search history.

(56) References Cited

U.S. PATENT DOCUMENTS

| | | | | |
|---|---|---|---|---|
| 7,440,044 B2* | 10/2008 | Peterson | ........... | G02F 1/133617 313/503 |
| 8,253,885 B2* | 8/2012 | Maeda | .............. | G02F 1/133602 349/106 |
| 8,269,420 B2* | 9/2012 | Morizawa | .......... | C09K 11/7731 313/479 |
| 8,820,997 B2* | 9/2014 | Minami | ............. | G02B 27/2214 362/602 |
| 9,304,355 B2* | 4/2016 | Lee | ........................ | H01J 29/90 |
| 10,323,104 B2* | 6/2019 | Shin | ........................ | C08J 5/18 |
| 2009/0236621 A1 | 9/2009 | Chakraborty | | |
| 2014/0347601 A1* | 11/2014 | Gibson | ................ | G02B 26/005 349/62 |
| 2015/0205159 A1* | 7/2015 | Itou | ................... | G02F 1/133514 349/110 |
| 2017/0329179 A1* | 11/2017 | Cho | .................. | G02F 1/133609 |

* cited by examiner

*Primary Examiner* — Peggy A Neils
(74) *Attorney, Agent, or Firm* — Millen White Zelano and Branigan, PC; Csaba Henter (57) ABSTRACT

The present invention relates to an electro-optical switching element comprising at least one light source, and a light converting layer, and to a use of the electro-optical switching element in an optical device. The invention further relates to an optical device comprising the electro-optical switching element.

17 Claims, 5 Drawing Sheets

ELECTRO-OPTICAL SWITCHING ELEMENT AND DISPLAY DEVICE

FIELD OF THE INVENTION

The present invention relates to an electro-optical switching element comprising at least one light source, and a light converting layer, and to a use of the electro-optical switching element in an optical device. The invention further relates to an optical device comprising the electro-optical switching element.

BACKGROUND ART

Optical properties of light from an electro-optical switching element comprising at least one light source, and a light converting layer are used in a variety of optical applications especially for optical devices.

For example, as described in WO 2013/183751 A, JP 2014-52606 A, JP 3820633 B, JP 3298263 B, EP 01403355 A, JP H04-12323 A, EP 02056158 A, WO 2010/143461 A, JP 2007-178902 A, JP 2003-233070 A Patent Literature
1. WO 2013/183751 A
2. JP 2014-52606 A
3. JP 3820633 B
4. JP 3298263 B
5. EP 01403355 A
6. JP H04-12323 A
7. EP 02056158 A
8. WO 2010/143461 A
9. JP 2007-178902 A
10. JP 2003-233070A Non Patent Literature

SUMMARY OF THE INVENTION

However, the inventors newly have found that there is still one or more of considerable problems for which improvement is desired, as listed below.
1. An electro optical switching element having simple device configuration and shows better color purity of light emission from the device is desired.
2. An electro optical switching element having higher out-coupling efficiency is required.
3. An electro optical switching element showing less color shift and/or better brightness contrast of the element under incident light is desired.

The inventors aimed to solve the all aforementioned problems.

Surprisingly, the inventors have found a novel electro optical switching element (100), comprising at least one light source (110), and a light converting layer (120), wherein the light converting layer (120) comprises a light converting material (130) that can convert light wavelength of the light from the light source (110) into longer light wavelength, and a coloring agent (140) that can absorb a visible light, wherein the coloring agent (140) is selected from the group consisting of dye, pigment and a combination of any of these, wherein the electro optical switching element (100) comprises a plural of light scattering particles (150), solves the problems 1 and 2 at the same time.

Further advantages of the present invention will become evident from the following detailed description.

In another aspect, the invention relates to use of the electro optical switching element (100) in an optical device.

In another aspect, the invention further relates to an optical device (210), including the electro optical switching element (100) comprising at least one light source (110), and a light converting layer (120), wherein the light converting layer (120) comprises a light converting material (130) that can convert light wavelength of the light from the light source (110) into longer light wavelength, and a coloring agent (140) that can absorb a visible light, wherein the coloring agent (140) is selected from the group consisting of dye, pigment and a combination of any of these, wherein the electro optical switching element (100) comprises a plural of light scattering particles (150).

LIST OF REFERENCE SIGNS IN FIG. 1

100. an electro optical switching element
110. a light source
120. a light converting layer
130. a light converting material
140. a coloring agent
150. a plural of light scattering particles
160. a light modulator (optional)
170. a light scattering layer

LIST OF REFERENCE SIGNS IN FIG. 2

200. an electro optical switching element
210. a light source
211. a blue light source
212. a light guide plate
220. a light converting layer
221. a black matrix
230. a light converting material
240. a coloring agent
250. a plural of light scattering particles
260. a light modulator 261. a polarizer
262. a transparent substrate
263. a liquid crystal layer
270. a light scattering layer

LIST OF REFERENCE SIGNS IN FIG. 3

300. an electro optical switching element
310. a light source
320. a light converting layer
330. a light converting material
340. a coloring agent
350. a plural of light scattering particles
360. a light modulator (optional)
370. a light scattering layer

LIST OF REFERENCE SIGNS IN FIG. 4

420. a light converting layer
430. a light converting material
440. a coloring agent

LIST OF REFERENCE SIGNS IN FIG. 5

500. an electro optical switching element
510. a light source
511. a blue light source
512. a light guide plate
520. a light converting layer
521. a black matrix
530. a light converting material
540. a coloring agent
550. a plural of light scattering particles
560. a light modulator (optional)
561. a polarizer
562. a transparent substrate
563. a liquid crystal layer
570. a light scattering layer
580. a layer having slant structures

LIST OF REFERENCE SIGNS IN FIG. 6

600. an electro optical switching element
610. a blue light source (switchable)
620. a light converting layer
630. a light converting material
640. a coloring agent
650. a plural of light scattering particles
670. a light scattering layer

LIST OF REFERENCE SIGNS IN FIG. 7

700. an electro optical switching element
710. a light source
720. a light converting layer
721. a black matrix
730. a light converting material
740. a coloring agent
750. a plural of light scattering particles
761. a transparent electrode
762. a LC layer (doped with Dichroic Dye)
763. a transparent pixel electrode
764. a transparent substrate
770. a light scattering layer

LIST OF REFERENCE SIGNS IN FIG. 8

800. an electro optical switching element
810. a light source
820. a light converting layer
830. a light converting material
840. a coloring agent
850. a plural of light scattering particles
861. a transparent substrate
862. a transparent electrode
863. a LC layer (doped with Dichroic Dye)
864. a transparent pixel electrode
865. a TFT (Thin film transistor)

LIST OF REFERENCE SIGNS IN FIG. 9

900. an electro optical switching element
910. a light source
911. a blue light source
912. a light guide plate
920. a light converting layer
921. a black matrix
930. a light converting material
940. a coloring agent
950. a plural of light scattering particles
960. a light modulator
961. a transparent substrate
962. a TFT (Thin film transistor)
963. MEMS (Micro Electro Mechanical Systems) Shutter

LIST OF REFERENCE SIGNS IN FIG. 10

10. an electro optical switching element
101. the luminance meter CS-1000A (Konica Minolta Holdings Inc.)
102. National PRF-100 W light source
110. a 450 nm LED light source
120. a light converting layer
130. a light converting material
140. a coloring agent
150. a plural of light scattering particles
170. a light scattering layer

DETAILED DESCRIPTION OF THE INVENTION

In a general aspect, an electro optical switching element (100), comprising at least one light source (110), and a light converting layer (120), wherein the light converting layer (120) comprises a light converting material (130) that can convert light wavelength of the light from the light source (110) into longer light wavelength, and a coloring agent (140) that can absorb a visible light, wherein the coloring agent (140) is selected from the group consisting of dye, pigment and a combination of any of these, wherein the electro optical switching element (100) comprises a plural of light scattering particles (150).

According to the present invention, the type of light source (100) in the electro optical switching element is not particularly limited.

Preferably, UV or blue single color light source can be used.

More preferably, the light source emits light having peak wavelength in a blue light region, such as blue LED, CCFL, EL, OLED, or a combination of any of these, can be used.

In a preferred embodiment of the present invention, additionally, the light source (110) can embrace a light guide plate to increase light uniformity from the light source (110).

For the purpose of the present invention, the term "Blue" is taken to mean a light wavelength between 380 nm and 515 nm.

Preferably, it is between 430 nm and 490 nm. More preferably, it is between 450 nm and 470 nm.

According to the present invention, the term "layer" includes "sheet" like structure.

According to the present invention, the light converting layer (120) can be made from at least the light converting material (130), a coloring agent (140), and a matrix material.

As the matrix material, any type of publically known transparent matrix material preferable for optical films can be used as desired, because, the matrix material better to have good processability in fabrication of the light converting layer (120), and has long-term durability.

In a preferred embodiment of the present invention, a photo-curable polymer, and/or photo-sensitive polymer can be used. For example, acrylate resins used in LCD color filter, any photo-curable poly siloxane, a polyvinylcinnamate widely used as a photo-curable polymer or a combination of any of these.

According to the present invention, as the light converting material (130), any material that absorbs visible light/UV light and emits visible light in a longer wavelength than the absorbed light can be used.

Preferably, the light converting material (130) of the light converting layer (120) can be selected from the group consisting of an organic dyes such as organic luminescent and/or organic phosphorescent material, inorganic phosphor material, quantum sized inorganic semiconductor material such as quantum dot material, quantum rod material, and a combination of any of these.

Thus, according to the present invention, in some embodiments, the light converting material (130) of the light converting layer (120) is selected from the group consisting of an organic fluorescent material, organic phosphorescent material, phosphor material, quantum sized inorganic semiconductor material and a combination of any of these.

According to the present invention, the term "quantum sized" means the size of the inorganic semiconductor material itself without ligands or another surface modification, which can show the quantum size effect.

As organic dyes, any kinds of fluorescent dyes and/or phosphorescent dyes can be used as desired. Such as commercially available laser dyes and/or light emissive dyes used in an organic light emissive diode. For examples, Laser dyes from Indeco Corporation, dyes from American Dye Sources.

In a preferred embodiment of the present invention, as organic dyes for blue emission use, laser dyes from Indeco Corporation such as Coumarin 460, Coumarin 480, Coumarin 481, Coumarin 485, Coumarin 487, Coumarin 490, LD 489, LD 490, Coumarin 500, Coumarin 503, Coumarin 504, Coumarin 504T, Coumarin 515; commercially available luminescent dyes such as Perylene, 9-amino-acridine, 12(9-anthroyoxy)stearic acid, 4-phenylspyro[furan-2(3H), 1'-futalan]-3,3'-dione, N-(7-dimethylamino-4-methylcoumarynyl)maleimide; dyes from American Dye Sources such as ADS135BE, ADS040BE, ADS256FS, ADS086BE, ADS084BE; or a combination of any of these, can be used.

As an organic dyes for green emission use, laser dyes from Indeco Corporation such as Coumarin 522/522B, Coumarin 525 or a combination of any of these can be used preferably.

As an organic dyes for red emission use, laser dyes from Indeco Corporation such as DCM, Fluorol 555, Rhodamine 560 Perchlorate, Rhodamine 560 Chloride, LDS 698; dyes from American Dye Source Inc., such as ADS055RE, ADS061RE, ADS068RE, ADS069RE, ADS076RE or a combination of any of these, can be used in this way preferably.

According to the present invention, as organic dyes, dyes developed for Organic Light Emitting Diode (hereafter "OLED") also can be used.

Such as the dyes described in Japanese patent JP 2795932 B, the dyes described in the paper S. A. Swanson et al, JP 2004-263179 A, JP 2006-269819 A and/or JP 2008-091282 A, can be used.

According to the present invention, in some embodiments, one or more of red organic dyes together with one or more of green light emitting dyes which can convert UV light and/or blue light into green light, can be used for red emission use like described in JP 2003-264081 A.

Preferably, the surface of the organic dyes can be modified by one or more of surfactants or dispersing agents to facilitate dispersion of the organic dyes. For example, by modifying them with alkyl chains to make them soluble in organic solvents.

As inorganic phosphors, any kinds of commercially available inorganic phosphors can be used as desired.

For blue inorganic phosphors, Cu activated zinc sulfide phosphors like described in Japanese patent application laid-open No. JP2002-062530 A, Eu activated halophosphate phosphors and/or Eu activated aluminate phosphors like described in JP 2006-299207 A, or a combination of any of these can be used preferably.

For green inorganic phosphors, Ce or Tb activated rare earth element borate phosphors as described in JP 2006-299207 A, beta-sialon green phosphors described in JP 2007-262417 A, and a combination of any of these, can be used preferably.

For red inorganic phosphors, Eu activated lanthanum sulfide phosphors, Eu activated yttrium sulfide phosphors described in JP 2006-299207 A, yellow phosphors which consist of BaS and $Cu^{2+}$ as an emission site described in JP 2007-063365 A, red phosphors which consist of $Ba_2ZnSe_3$ and $Mn^{2+}$ described in JP 2007-063366 A, Ce activated garnet phosphors described in JP 3503139 B, red phosphors described in JP 2005-048105 A, Ca alpha-sialon red phosphors described in JP 2006-257353 A, or a combination of any of these, can be used preferably.

Preferably, the surface of the inorganic phosphors can be modified by one or more of surfactants or dispersing agents to facilitate dispersion of the inorganic phosphors.

Generally, quantum sized inorganic semiconductor material such as quantum dot material, and/or quantum rod material can emit sharp vivid colored light due to quantum size effect.

As a quantum dot, publically available quantum dot (hereafter "q-dot"), for example from Sigma-Aldrich, can be used preferably as desired.

Without wishing to be bound by theory, it is believed that light luminescence from dipole moment of the light converting material having elongated shape may lead higher out-coupling efficiency than the out-coupling efficiency of spherical light emission from q-dot, organic fluorescent material, and/or organic phosphorescent material, phosphor material.

In other words, it is believed that the long axis of the light converting material having elongated shape such as q-rods, elongated shaped organic dyes, can align parallel to a substrate surface on average with higher probability and their dipole moments also can align parallel to the substrate surface on average with higher probability.

Thus, in some embodiments, the light converting material (130) can be selected from a quantum rod material or organic dye having elongated shape to realize better out-coupling effect.

According to the present invention, to realize sharp vivid color(s) of the device and better out-coupling effect, quantum rod materials are more preferable.

In a preferred embodiment of the present invention, the quantum rod material can be selected from the group consisting of II-VI, III-V, or IV-VI semiconductors and combinations of any of these.

More preferably, the quantum rod material can be selected from the groups consisting of Cds, CdSe, CdTe, ZnS, ZnSe, ZnTe, ZnO, GaAs, GaP, GaAs, GaSb, HgS, HgSe, HgSe, HgTe, InAs, InP, InSb, AlAs, AlP, AlSb, $Cu_2S$, $Cu_2Se$, CuInS2, $CuInSe_2$, $Cu_2(ZnSn)S_4$, $Cu_2(InGa)S_4$, $TiO_2$ alloys and combination of any of these.

For example, for red emission use, CdSe rods, CdSe dot in CdS rod, ZnSe dot in CdS rod, CdSe/ZnS rods, InP rods, CdSe/CdS rods, ZnSe/CdS rods or combination of any of these. For green emission use, such as CdSe rods, CdSe/ZnS rods, or combination of any of these, and for blue emission use, such as ZnSe, ZnS, ZnSe/ZnS core shell rods, or combination of any of these.

Examples of quantum rod material have been described in, for example, the international patent application laid-open No. WO2010/095140A.

In a preferred embodiment of the invention, the length of the overall structures of the quantum rod material is from 8 nm to 500 nm. More preferably, from 10 nm to 160 nm. The overall diameter of the said quantum rod material is in the range from 1 nm to 20 nm. More particularly, it is from 1 nm to 10 nm.

Preferably, the quantum sized inorganic semiconductor material such as quantum rod and/or quantum dot comprises a surface ligand.

The surface of the quantum rod and/or quantum dot materials can be over coated with one or more kinds of surface ligands.

Without wishing to be bound by theory it is believed that such a surface ligands may lead to disperse the quantum sized inorganic semiconductor material in a solvent more easily.

The surface ligands in common use include phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Dedecyl amine (DDA), Tetradecyl amine (TDA), Hexadecyl amine (HDA), and Octadecyl amine (ODA), thiols such as hexadecane thiol and hexane thiol; mercapto carboxylic acids such as mercapto propionic acid and mercaptoundecanoic acid; and a combination of any of these.

Examples of surface ligands have been described in, for example, the international patent application laid-open No. WO 2012/059931A.

According to the present invention, as the coloring agent (140) that can absorb a visible light can be selected from the group consisting of dye, pigment and a combination of any of these. Preferably, any type of publically known dye and/pigment for LCD color filter can be used in this way. For examples, as shown in "Technologies on LCD Color Filter and Chemicals" CMC Publishing P. 53 (1998)" azo-chelate pigments, fused azo pigments, quinacridone pigments, isoindolinone pigments, perylene pigments perinone pigments, insoluble azo pigments, phthalocyanice pigments, dioxazine pigments, anthraquinone pigments, thioin pigments or a combination of any of these.

According to the present invention, one of main requirements for the coloring agent (140) is to absorb an excitation light from the light source (110) which light excites the light converting material (130) in the light converting layer to improve color purity of light from the light converting layer. Therefore, commercially available yellow pigments for LCD color filter also can be used in a green sub color pixel if the light converting layer has the green sub color pixel.

According to the present invention, as the light scattering particles (150), any type of publically known light scattering particles having different refractive index from the matrix material of the layer which includes the said light scattering particles and can give Mie scattering effects, can be used preferably as desired.

For examples, small particles of inorganic oxides such as $SiO_2$, $SnO_2$, CuO, CoO, $Al_2O_3$ $TiO_2$, $Fe_2O_3$, $Y_2O_3$, ZnO, MgO; organic particles such as polymerized polystyrene, polymerized PMMA; or a combination of any of these; can be used preferably.

Preferably, the average particle diameter of the light scattering particles (150) can be in the range from 350 nm to 5 μm.

Without wishing to be bound by theory, it is believed that more than 350 nm average particle diameter may lead to strong forward scattering caused by Mie scattering in a later, even if the refractive index difference between the light scattering particles and the layer matrix is as small as 0.1.

On the other hand, to obtain better layer forming properties by using the light scattering particles (150), maximum average particle diameter is 5 um or less, preferably. More preferably, from 500 nm to 2 μm.

In some embodiments of the present invention, preferably, the electro optical switching element (100) further comprises a light modulator (160).

In a preferred embodiment of the present invention, the light modulator (160) can be selected from the group consisting of liquid crystal element, Micro Electro Mechanical Systems (here in after "MEMS"), electro wetting element, and electrophoretic element.

In the case of the light modulator (160) is a liquid crystal element, any type of liquid crystal element can be used in this way.

For example, twisted nematic mode, vertical alignment mode, IPS mode, guest host mode liquid crystal element, which commonly used for LCDs are preferable.

Furthermore, according to the present invention, normally black TN mode liquid crystal element is also applicable as the light modulator (160).

Generally, without wishing to be bound by theory, it is said that the normally black TN mode can realize higher contrast ratio but fabrication process is complicated due to the different cell gap in each color pixel to keep good white balance.

According to the present invention, there is no need to change the cell gap of normally black TN mode LC element at each pixel.

Because, according to the present invention, a single color excitation light source can be used preferably in the combination with the color converting layer (120). Such as, as a single color excitation light source, UV LED, blue LED as described in page 15.

In that case, the light source emits light having one peak wavelength region and the intensity of the excitation light from the light source (110) can be controlled by the normally black TN mode LC layer having same cell gap at each pixel, then, the excitation light goes into the light converting layer (120) and converted into longer wavelength.

In some embodiments of the present invention, preferably, the electro optical switching element (100) comprises a light scattering layer (170) including the plural of light scattering particles (150).

In a preferred embodiment of the present invention, the light scattering layer (170) can be placed in between the light source (110) and the light converting layer (120) to reduce glare state of the device caused by ambient light scattering.

Thus, in some embodiments of the present invention, the light source (110), the light scattering layer (170), and the light converting layer (120), are placed in this sequence.

Preferably, the plural of light scattering particles (150) can be only in the light scattering layer (170) and/or one or more of other layers that is placed the light source side from the light converting layer (120).

Without wishing to be bound by theory, it is considered that such embodiment may lead less color shift and/or better the brightness contrast of the element under incident light.

Figure 1:
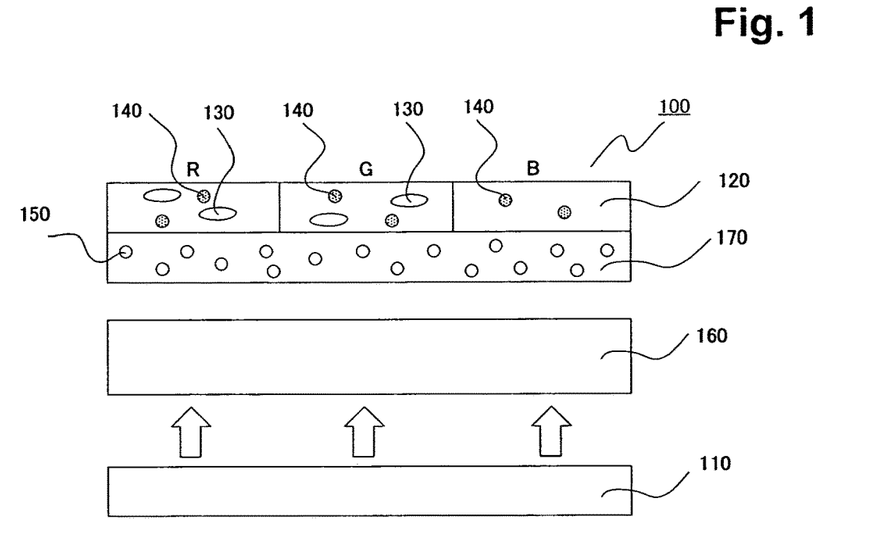
FIG. 1: shows a cross sectional view of a schematic of an electro optical switching element (100).

Preferably, the light scattering layer (170) is placed onto the surface of the light source side of the light converting layer (120) directly like shown in FIG. 1.

Figure 3:
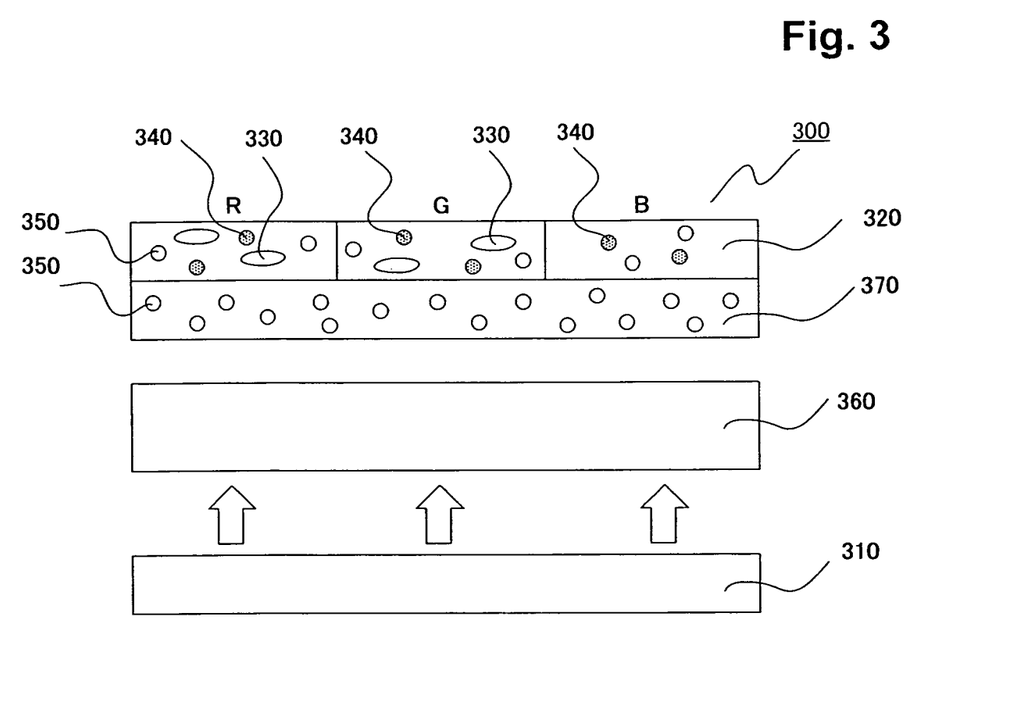
FIG. 3: shows a cross sectional view of a schematic of another embodiment of an electro optical switching element of the invention.
Figure 8:
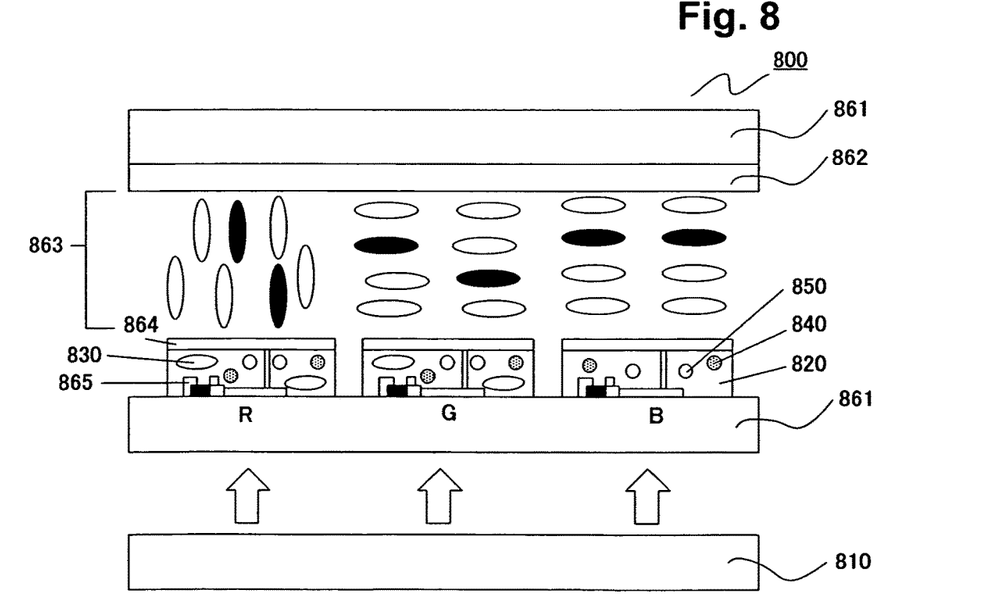
FIG. 8: shows a cross sectional view of a schematic of another embodiment of an electro optical switching element of the invention.

In some embodiments of the present invention, optionally, the light converting layer (120) comprises the plural of light scattering particles (150) like shown in FIG. 3, FIG. 8.

Preferably, the plural of light scattering particles (150) can be in the light converting layer (120), in case of the light modulator (160) is placed behind the light converting layer (120) viewed from the light source (110).

In some embodiments of the present invention, the light modulator (160) is placed on the light extraction side of the light converting layer (120).

In some embodiments of the present invention, the light modulator (160) is placed in between the light source (110) and the light converting layer (120).

According to the present invention, in some embodiments, optionally, the surface of the light extraction side of the light converting layer (120) is structured to increase the out-coupling efficiency of the device (100).

Figure 4:
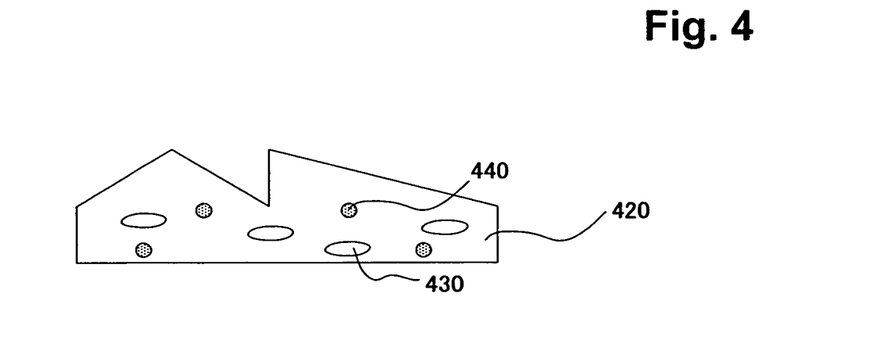
FIG. 4: shows a cross sectional view of a schematic of another embodiment of a part of a light converting layer of an electro optical switching element of the invention.

Without wishing to be bound by theory it is believed that a slant structure, like shown in FIG. 4, can increase the amount of light that leaves the light converting layer. These structures can be fabricated by well-known techniques, for example with using nano-imprinting techniques.

According to the present invention, in some embodiments, the other surface of the light converting layer (120), which faces to light source (110), can have a slant structure. Without wishing to be bound by theory, it is believed that the slant structure may prevent light loss by the total reflection.

In general, the slant structure can overlap for the plural sub color pixels. Therefore, the slant structure is applicable even for small size pixels.

In some embodiments, optionally, the electro optical switching element (100) further comprises a layer (180) whose surface of the light extraction side is structured.

Figure 5:
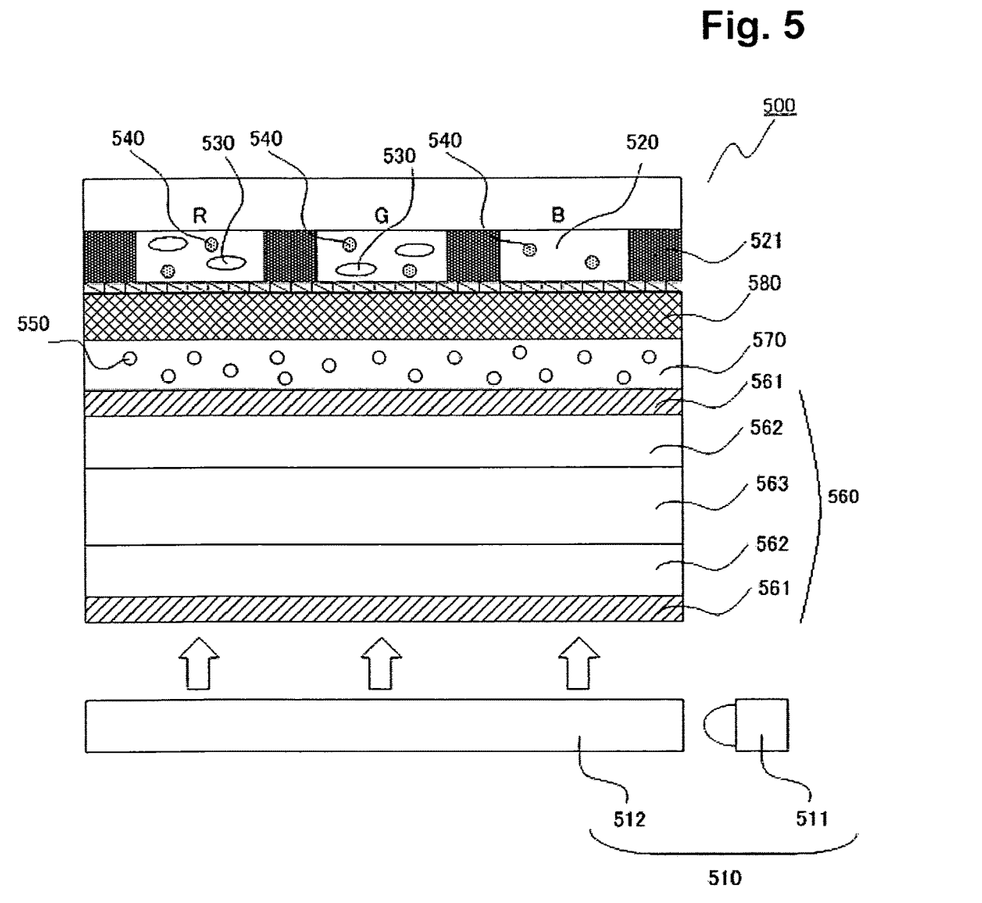
FIG. 5: shows a cross sectional view of a schematic of another embodiment of an electro optical switching element of the invention.
Figure 6:
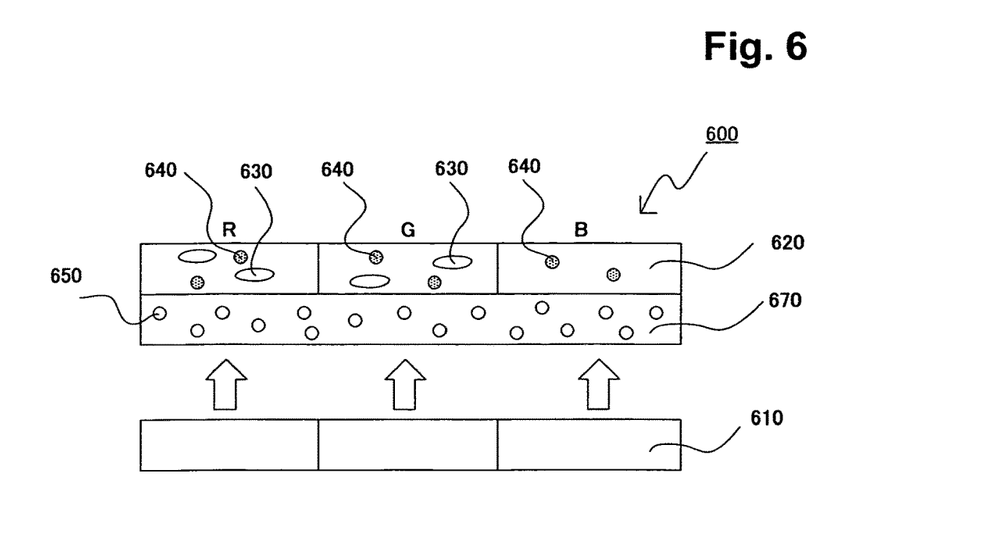
FIG. 6: shows a cross sectional view of a schematic of another embodiment of an electro optical switching element of the invention.

Preferably, the layer (180) has one or more of slant structure like shown in FIG. 5.

In some embodiments of the present invention, optionally, the light source (110) is switchable.

According to the present invention, the term "switchable" means that the light can selectively be switched on or off.

In a preferred embodiment of the present invention, the switchable light source can be selected from the group consisting of active matrix OLED, passive matrix OLED, active matrix EL, passive matrix EL, a plural of LEDs and a combination of any of these.

In some embodiments of the present invention, the light converting material (130) of the light converting layer (120) is selected from the group consisting of an organic fluorescent material, organic phosphorescent material, phosphor material, quantum dot material, quantum rod material or a combination of any of these.

In some embodiments of the present invention, optionally, the electro optical switching element (100) further comprises a selective light reflection layer (190) placed in between the light source (110) and the light converting layer (120).

According to the present invention, the term "light reflection" means reflecting at least around 60% of incident light at a wavelength or a range of wavelength used during operation of a polarized light emissive device. Preferably, it is over 70%, more preferably, over 75%, the most preferably, it is over 80%.

According to the present invention, the selective light reflection layer (190) can pass through the peak light wavelength from the light source (110) and can reflect the converted light from the light converting layer (120)

A material for the selective light reflection layer is not particularly limited. Well known materials for a selective light reflection layer can be used preferably as desired.

According to the present invention, the selective light reflection layer can be single layer or multiple layers.

In a preferred embodiment, the selective light reflection layer is selected from the group consisting of Al layer, Al+MgF$_2$ stacked layers, Al+SiO stacked layers, Al+dielectric multiple layer, Au layer, dielectric multiple layer, Cr+Au stacked layers; with the selective light reflection layer more preferably being Al layer, Al+MgF$_2$ stacked layers, Al+SiO stacked layers, cholesteric liquid crystal layer, stacked cholesteric liquid crystal layers.

Examples of cholesteric liquid crystal layers have been described in, for example, the international patent application laid-open No. WO 2013/156112A, WO 2011/107215 A.

In general, the methods of preparing the selective light reflection layer can vary as desired and selected from well-known techniques.

In some embodiments, the selective light reflection layer expect for cholesteric liquid crystal layers can be prepared by a gas phase based coating process (such as Sputtering, Chemical Vapor Deposition, vapor deposition, flash evaporation), or a liquid-based coating process.

In case of the cholesteric liquid crystal layers, can be prepared by method described in, for example, WO 2013/156112A, or WO 2011/107215 A.

In some embodiments of the present invention, preferably, the light converting layer (120) comprises first and second sub color areas (200), in which at least first sub color area emits light having longer peak wavelength than the second sub color areas when it is illuminated by light source.

In a preferred embodiment of the present invention, the light source (110) of the electro optical switching element (100) is blue light source such as blue LED(s) and the light converting layer (120) comprises green sub color areas and red sub color areas.

In a preferred embodiment of the present invention, the light converting layer (120) comprises red sub color areas, green sub color areas and blue sub color areas.

More preferably, the light converting layer (120) mainly consists of red sub color areas, green sub color areas and blue sub color areas like described in FIG. 1-3, 5-9.

Even more preferably, in case of blue light emitting light source such as blue LED(s) is used, the blue sub color areas can be made without blue light converting material (130).

In that case, the blue sub color areas also can be made without a blue coloring agent (140) and blue light converting material (130).

In some embodiments of the present invention, optionally, the polarized light emissive device (100) further comprises a black matrix (hereafter "BM").

In a preferred embodiment, the BM is placed in between the sub color areas like described in FIG. 1. In other words, sub color areas of the present invention can be marked out by one or more of the BM.

A material for the BM is not particularly limited. Well known materials, especially well known BM materials for color filters can be used preferably as desired. Such as black dye dispersed polymer composition, like described in JP 2008-260927A, WO 2013/031753A.

Fabrication method of the BM is not particularly limited, well known techniques can be used in this way. Such as, direct screen printing, photolithography, vapor deposition with mask.

In another aspect, the invention relates to use of the electro optical switching element (100) in an optical device.

In another aspect, the invention further relates to an optical device (210), including the electro optical switching element (100) comprising at least one light source (110), and a light converting layer (120), wherein the light converting layer (120) comprises a light converting material (130) that can convert light wavelength of the light from the light source (110) into longer light wavelength, and a coloring agent (140) that can absorb a visible light selected from the group consisting of dye, pigment and a combination of any of these, wherein the electro optical switching element (100) comprises a plural of light scattering particles (150).

In a preferred embodiment of the present invention, the optical device (210) can be selected from the group consisting of a liquid crystal display, OLED, MEMS display, electro wetting display, and electrophoretic display.

More preferably, the optical device (210) can be a liquid crystal display. Such as twisted nematic liquid crystal display, vertical alignment mode liquid crystal display, IPS mode liquid crystal display, guest host mode liquid crystal display, or the normally black TN mode liquid crystal display.

Examples of optical devices have been described in, for example, WO 2010/095140 A2 and WO 2012/059931 A1.

The invention is described in more detail in reference to the following examples, which are only illustrative and do not limit the scope of the invention.

EXAMPLES

Example 1

Figure 2:
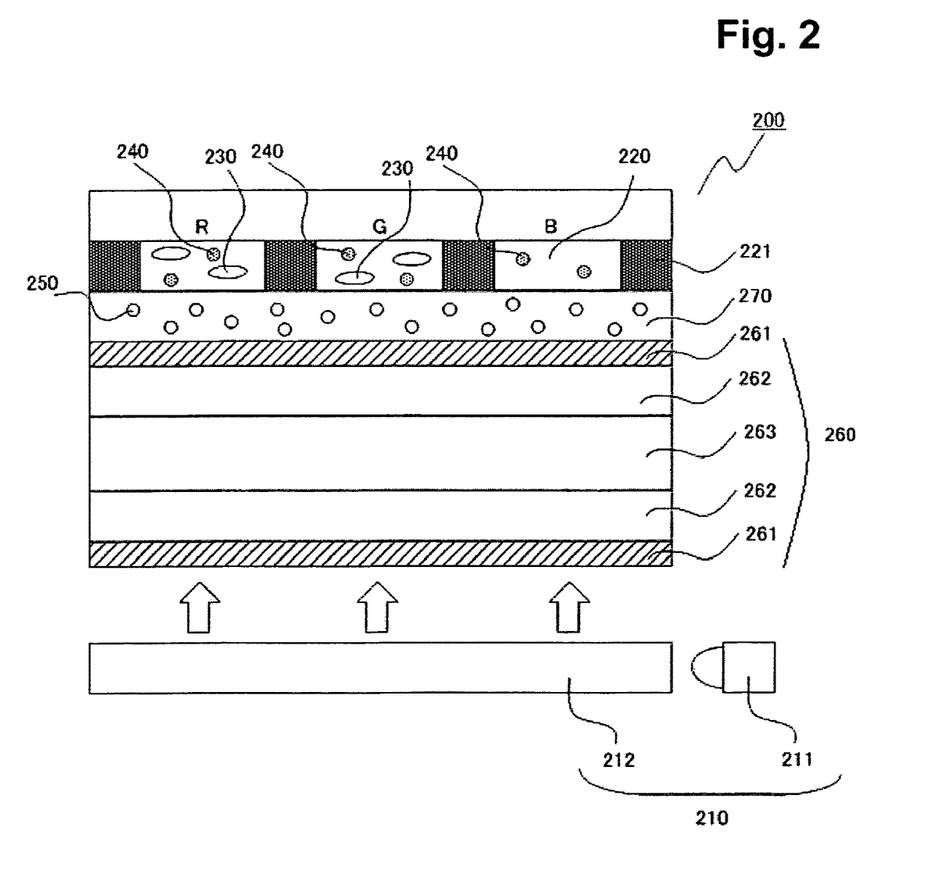
FIG. 2: shows a cross sectional view of a schematic of another embodiment of an electro optical switching element of the invention.

In the present invention, the light scattering layer can be separately piled on the color conversion layer as shown in FIG. 2.

The light scattering layer can be common to all the pixels of the element. And hence, it can be fabricated with one sheet of the film in which results in no increase in photolithography processes in the fabrication. In this example, the light scattering layer is contacted the color conversion layer directly and faces the back light source.

The light scattering particles can also be in the color conversion layer and/or in another layer like described in FIG. 3.

Blue LED(s) can be used as the light source (211), (310) preferably.

Example 2

FIG. 4 shows one example of color conversion layer having a slant structure to increase the out coupling efficiency of the element. Without wishing to be bound by theory, it is believed that such a slant structure or curved structure in the color conversion layer can increase the amount of light that goes out of the color conversion layer.

And the slant structures and the curved structures can be fabricated by well-known techniques such as nano-imprinting techniques.

Such slant structures or curved structures can be also fabricated on the surface of any other layer such as light scattering layer.

Example 3

Figure 7:
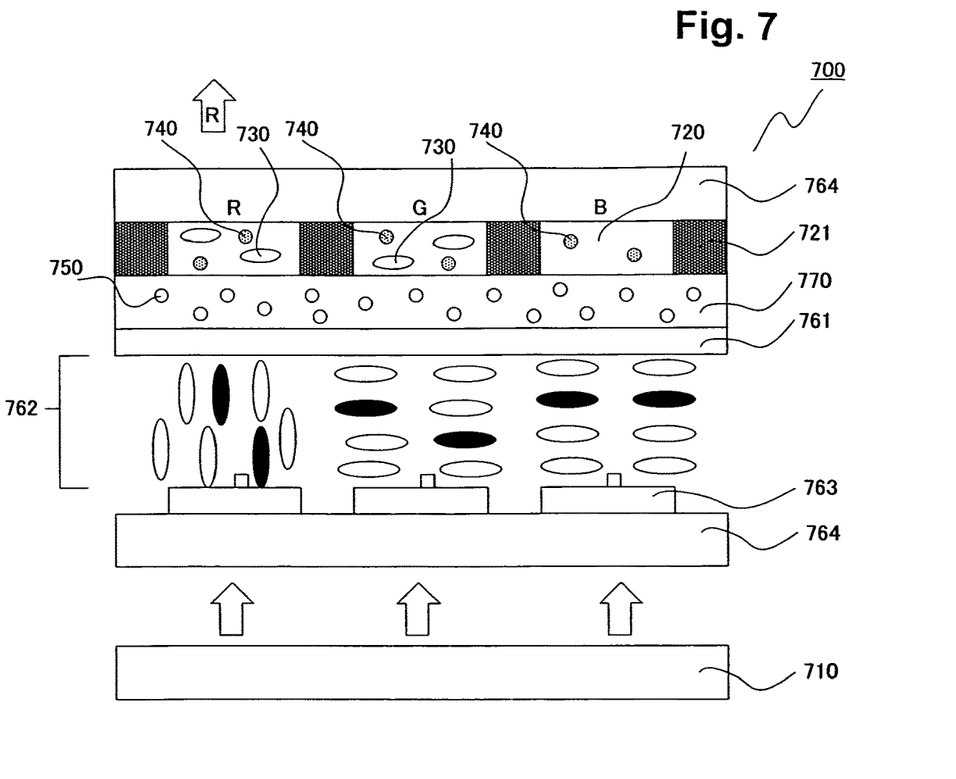
FIG. 7: shows a cross sectional view of a schematic of another embodiment of an electro optical switching element of the invention.

FIG. 7 shows one example of the present invention.

In this example, guest host mode liquid crystal (762) is used with blue light source and therefore, two polarizers can be omitted.

Example 4

FIG. 8 shows another example of the present invention.

In this example, the light converting layer having a plural of light scattering particles is fabricated as the layer insulation.

Example 5

Figure 9:
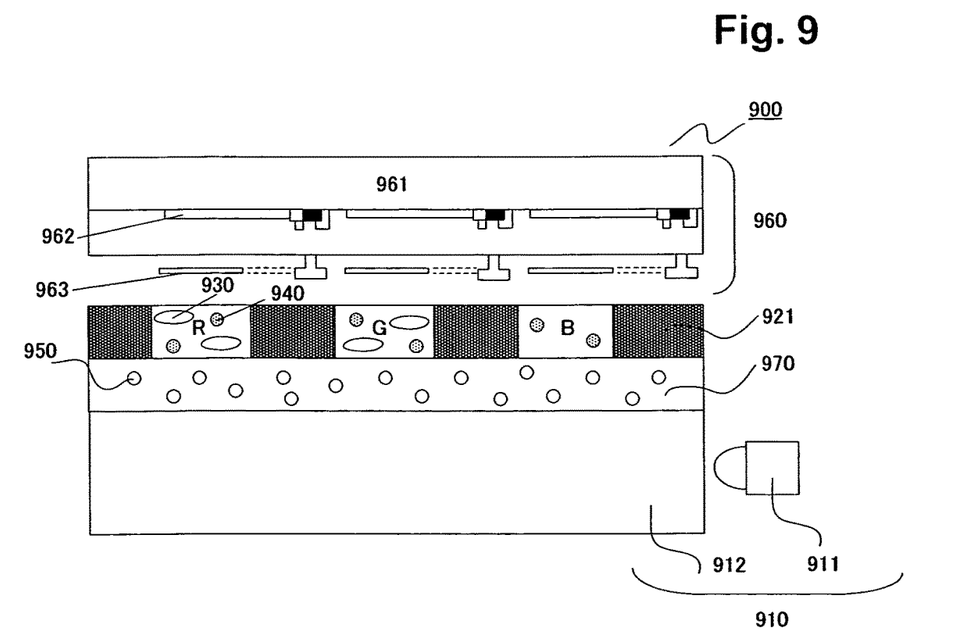
FIG. 9: shows a cross sectional view of a schematic of another embodiment of an electro optical switching element of the invention.

FIG. 9 shows another example of the present invention.

In this example, MEMS shutter is used preferably.

The light converting layer can be fabricated as the layer insulation of MEMS shutter system instead of the current example and a plural of light scattering particles also can be incorporated in the light converting layer.

Each feature disclosed in this specification, unless stated otherwise, may be replaced by alternative features serving the same, equivalent, or similar purpose. Thus, unless stated otherwise, each feature disclosed is but one example of a generic series of equivalent or similar features.

Definition of Terms

According to the present invention, the term "transparent" means at least around 60% of incident light transmittal at the thickness used in a polarized light emissive device and at a wavelength or a range of wavelength used during operation of a polarized light emissive device. Preferably, it is over 70%, more preferably, over 75%, the most preferably, it is over 80%.

The term "fluorescence" is defined as the physical process of light emission by a substance that has absorbed light or other electromagnetic radiation. It is a form of luminescence. In most cases, the emitted light has a longer wavelength, and therefore lower energy, than the absorbed radiation.

The term "semiconductor" means a material which has electrical conductivity to a degree between that of a conductor (such as copper) and that of an insulator (such as glass) at room temperature.

The term "inorganic" means any material not containing carbon atoms or any compound that containing carbon atoms ionically bound to other atoms such as carbon monoxide, carbon dioxide, carbonates, cyanides, cyanates, carbides, and thiocyanates.

The term "emission" means the emission of electromagnetic waves by electron transitions in atoms and molecules.

The working examples 1-7 below provide descriptions of the electro optical switching element of the present invention, as well as an in detail description of their fabrication.

Working Examples

Working Example 1: Fabrication of an Electro Optical Switching Element 1.0 g of polyvinyl cinnamate (Sigma-Aldrich) and 0.26 g of green pigment (Heliogen Green K9360), and 0.066 g of Coumarin 6 (Sigma-Aldrich) were dispersed in toluene (2 g) and stirred for 5 minutes at 90° C. in air condition.

A glass substrate was cleaned by sonicating in acetone.

Then the resulting solution was coated onto the cleaned glass substrate with using Doctor Blade technique. The resulting substrate was heated at 100° C. for 3 minutes at air condition to evaporate the solvent to fabricate 10 μm thick light converting layer.

After the heating, the film was exposed to 254 nm UV light (2.3 mW/cm$^2$) for 3 min under nitrogen flowing condition.

Then, the green color converting layer was rinsed with toluene for one minute and heated for 3 minutes at 100° C.

Finally, the green color converting layer fabricated onto the substrate was obtained.

0.5 g of polyvinyl cinnamate (purchased from Sigma-Aldrich) and 0.005 g of titanium oxide powder (95% rutile, under 1 micrometer fine powder; purchased from Koujundo Chemical Laboratory Co. Ltd.) were dispersed in toluene (4 g) and stirred for 5 minutes at 90° C. in air condition.

A glass substrate was cleaned by sonicating in acetone.

Then the resulting solution was coated onto a cleaned glass substrate with using spin-coating technique (1,000 r.p.m. for 30 sec.), and the substrate was heated at 100° C. in air condition.

After the heating, the substrate was exposed to 254 nm UV light (2.3 mW/cm$^2$) for 3 minutes under nitrogen flowing condition.

Then, the light scattering layer was rinsed with toluene for one minutes and heated for 3 minutes at 100° C.

Finally, 2 μm thick light scattering layer fabricated onto the glass substrate was obtained.

Then, the green color converting layer fabricated onto the substrate and the light scattering layer fabricated onto the glass substrate were faced directly of each other and contacted with using refractive index matching oil whose refractive index was 1.53.

The twisted nematic liquid crystal (TN-LC) cell with the thickness 4 μm was fabricated as the light modulator.

The liquid crystal (refractive index anisotropy; Δn 0.1262, dielectric anisotropy; Δε 4.5, from Merck KGaA) was used.

Two polarizers were put onto the both substrates of the TN-LC cell so that the transmission axis coincided with the rubbing direction for each side of the TN-CL cell. Then, one normally white type TN-LC cell was fabricated.

Then, the TN-LC cell was faced to the glass substrate of the light scattering layer and contacted the glass substrate.

Finally, the electro optical switching element 1 was fabricated.

In this working example, the green color converting layer fabricated onto the substrate and the light scattering layer fabricated onto the glass substrate were used. Instead of that, the green color converting layer and/or the light scattering layer can be peeled off from the substrate with well-known technique and it can be used in this invention.

Working Example 2: Fabrication of an Electro Optical Switching Element 1.0 g of polyvinyl cinnamate (Sigma-Aldrich) and 0.02 g of red pigment diketo-pyrrolo-pyrrole (Irgaphor red B CF), and 0.2 g of red quantum rods (from Qlight Nanotech, peak wavelength of the light emission; 631 nm) were dispersed in toluene (2 g) and stirred for 5 minutes at 90° C. in air condition.

The diameter and the length of each quantum rod measure with using TEM (Transmission Electron Microscope; TEM) were 6 nm and 27 nm respectively.

A glass substrate was cleaned by sonicating in acetone.

Then the resulting solution was coated onto the cleaned glass substrate with using Doctor Blade technique to fabricate light converting layer having 10 μm thickness. The resulting substrate was heated at 100° C. for 3 minutes at air condition to evaporate the solvent.

After the heating, the substrate was exposed to 254 nm UV light (2.3 mW/cm$^2$) for 3 minutes under nitrogen flowing condition.

Then, the red color converting layer was rinsed with toluene for one minutes and heated for 3 minutes at 100° C.

Finally, the red color converting layer fabricated onto the substrate was obtained.

The light scattering layer and the TN-LC cell as the light modulator were fabricated in the same manner as described in working example 1.

The light converting layer, the light scattering layer and the TN-LC cell were then faced directly of each other, and contacted in the same manner as described in working example 1.

Finally, the electro optical switching element 3 was fabricated.

Working Example 3: Fabrication of an Electro Optical Switching Element

The electro optical switching element 3 was fabricated in the same manner described in working example 1, expect for the light scattering layer was placed onto the opposite side of the color conversion layer.

In other words, the electro optical switching element 2 comprising the glass substrate/the light scattering layer/glass substrate/the light converting layer/TN-LC cell in this sequence.

Working Example 4: Fabrication of an Electro Optical Switching Element 1.0 g of polyvinyl cinnamate (Sigma-Aldrich), 0.26 g of green pigment (Heliogen Green K9360), 0.066 g of Coumarin 6 (Sigma-Aldrich), and 0.01 g of titanium oxide powder (95% rutile, under 1 micrometer file powder; purchased from Koujundo Chemical Laboratory Co. Ltd.) were dispersed in toluene (2 g) and stirred for 5 minutes at 90° C. in air condition.

A glass substrate was cleaned by sonicating in acetone.

Then the resulting solution was coated onto the cleaned glass substrate with using Doctor Blade technique to fabricate 10 µm thick light converting layer. The resulting substrate was heated at 100° C. for 3 minutes at air condition to evaporate the solvent.

After the heating, the film was exposed to 254 nm UV light (2.3 mW/cm$^2$) for 3 minutes under nitrogen flowing condition.

Then, the green color converting layer was rinsed with toluene for one minutes and heated for 3 minutes at 100° C.

Finally, the green color converting layer fabricated onto the substrate was obtained.

The twisted nematic liquid crystal (TN-LC) cell with the thickness 4 µm was fabricated in the same manner as described in working example 1.

Then, the TN-CL cell was faced to the light converting layer and contacted to the light converting layer.

Finally, the electro optical switching element 4 was fabricated.

Working Example 5: Evaluation of the Electro Optical Switching Elements Fabricated in Working Examples 1 to 4

405 nm LED light source was placed under the normally white TN-LC cell via a diffusive plate. The light from the color conversion layer in the vertical direction from the surface was measured with using the luminance meter CS-1000 A (Konica Minolta Holdings Inc.).

When driving voltage was applied to the TN-CN cell, the intention of the emitted light from the light converting layer was reduced. It indicates clearly that the TN-LC cell works as the light modulator. The obtained results were shown in Table 1-1 to 1-4.

TABLE 1-1

| | Working example 1 | | | | | | | |
|---|---|---|---|---|---|---|---|---|
| | Applied Voltage (V) | | | | | | | |
| | 0 | 1 | 2 | 2.5 | 3 | 3.5 | 4 | 5 |
| Light Intensity (W/sr/cm2/nm) at 520 nm with light Scattering layer (LI-S) | 0.0050 | 0.0049 | 0.0040 | 0.0026 | 0.0017 | 0.0012 | 0.0010 | 0.0008 |
| without light Scattering layer (the color conversion layer only) (LI-N) | 0.0047 | 0.0047 | 0.0037 | 0.0023 | 0.0014 | 0.0011 | 0.0009 | 0.0006 |
| The light intensity increasing ratio (%) = ((LI-S) − (LI-N))/(LI-N) * 100 | 7.5 | 5.6 | 7.5 | 12.3 | 15.3 | 16.0 | 16.2 | 17.1 |

TABLE 1-2

| | Working example 2 | | | | | | | |
|---|---|---|---|---|---|---|---|---|
| | Applied Voltage (V) | | | | | | | |
| | 0 | 1 | 2 | 2.5 | 3 | 3.5 | 4 | 5 |
| Light Intensity (W/sr/cm2/nm) at 635 nm with light Scattering layer (LI-S) | 0.0111 | 0.0111 | 0.0086 | 0.0058 | 0.0040 | 0.0031 | 0.0025 | 0.0020 |
| without light Scattering layer (the color conversion layer only) (LI-N) | 0.0105 | 0.0105 | 0.0082 | 0.0055 | 0.0038 | 0.0029 | 0.0024 | 0.0018 |
| The light intensity increasing ratio (%) = ((LI-S) − (LI-N))/(LI-N) * 100 | 7.5 | 5.3 | 5.5 | 5.7 | 5.8 | 5.8 | 5.9 | 6.0 |

TABLE 1-3

| | Working example 3 | | | | | | | |
|---|---|---|---|---|---|---|---|---|
| | Applied Voltage (V) | | | | | | | |
| | 0 | 1 | 2 | 2.5 | 3 | 3.5 | 4 | 5 |
| Light Intensity (W/sr/cm2/nm) at 520 nm with light Scattering layer (LI-S) | 0.006 | 0.006 | 0.0049 | 0.0031 | 0.0021 | 0.0016 | 0.0012 | 0.001 |
| without light Scattering layer (the color conversion layer only) (LI-N) | 0.0058 | 0.0058 | 0.0047 | 0.0029 | 0.0019 | 0.0014 | 0.0011 | 0.0009 |
| The light intensity increasing ratio (%) = ((LI-S) − (LI-N))/(LI-N) * 100 | 4.0 | 2.9 | 4.1 | 6.8 | 8.3 | 9.2 | 8.8 | 9.6 |

TABLE 1-4

| | Working example 4 | | | | | | | |
|---|---|---|---|---|---|---|---|---|
| | Applied Voltage (V) | | | | | | | |
| | 0 | 1 | 2 | 2.5 | 3 | 3.5 | 4 | 5 |
| Light Intensity (W/sr/cm2/nm) at 520 nm with light Scattering layer (LI-S) | 0.005 | 0.005 | 0.0041 | 0.0025 | 0.0016 | 0.0012 | 0.0009 | 0.001 |
| without light Scattering layer (the color conversion layer only) (LI-N) | 0.0047 | 0.0049 | 0.0038 | 0.0022 | 0.0013 | 0.0010 | 0.0008 | 0.0006 |
| The light intensity increasing ratio (%) = ((LI-S) − (LI-N))/(LI-N) * 100 | 8.3 | 5.9 | 8.5 | 13.9 | 17.2 | 18.4 | 18.6 | 18.6 |

Working Example 6: Fabrication of an Element and Measurement of Thereof 1.0 g of polyvinyl cinnamate (Sigma-Aldrich) and 0.26 g of green pigment (Heliogen Green K9360), and 0.066 g of Coumarin 6 (Sigma-Aldrich) were dispersed in toluene (2 g) and stirred for 5 minutes at 90° C. in air condition.

A glass substrate was cleaned by sonicating in acetone.

Then the resulting solution was coated onto the cleaned glass substrate with using Doctor Blade technique. The resulting substrate was heated at 100° C. for 3 minutes at air condition to evaporate the solvent to fabricate the light converting layer having 10 μm thickness.

After the heating, the film was exposed to 254 nm UV light (2.3 mW/cm$^2$) for 3 min under nitrogen flowing condition.

Then, the green color converting layer was rinsed with toluene for one minutes and heated for 3 minutes at 100° C.

Finally, the green color converting layer fabricated onto the substrate was obtained.

0.5 g of polyvinyl cinnamate (purchased from Sigma-Aldrich) and 0.005 g of titanium oxide powder (95% rutile, under 1 micrometer file powder; purchased from Koujundo Chemical Laboratory Co. Ltd.) were dispersed in toluene (4 g) and stirred for 5 minutes at 90° C. in air condition.

A glass substrate was cleaned by sonicating in acetone.

Then the resulting solution was coated onto a cleaned glass substrate with using spin-coating technique (1,000 r.p.m. for 30 sec.), and the substrate was heated at 100° C. in air condition.

After the heating, the substrate was exposed to 254 nm UV light (2.3 mW/cm$^2$) for 3 minutes under nitrogen flowing condition.

Then, the light scattering layer was rinsed with toluene for one minutes and heated for 3 minutes at 100° C.

Finally, the light scattering layer having 2 nm thickness fabricated onto the glass substrate was obtained.

Then, the green color converting layer fabricated onto the substrate and the light scattering layer fabricated onto the glass substrate were faced each other and contacted with using refractive index matching oil whose refractive index was 1.53.

Thus, the element 6 was fabricated.

Then, the optical properties of the element 6 (brightness contrast under the incident light & chromaticity) were measured with using the luminance meter CS-1000A (Konica Minolta Holdings Inc.) equipped with 450 nm LED light source as a back light source and a National PRF-100W light source as an incident light source as described in <6-1>, and <6-2> below.

<6-1>

Figure 10:
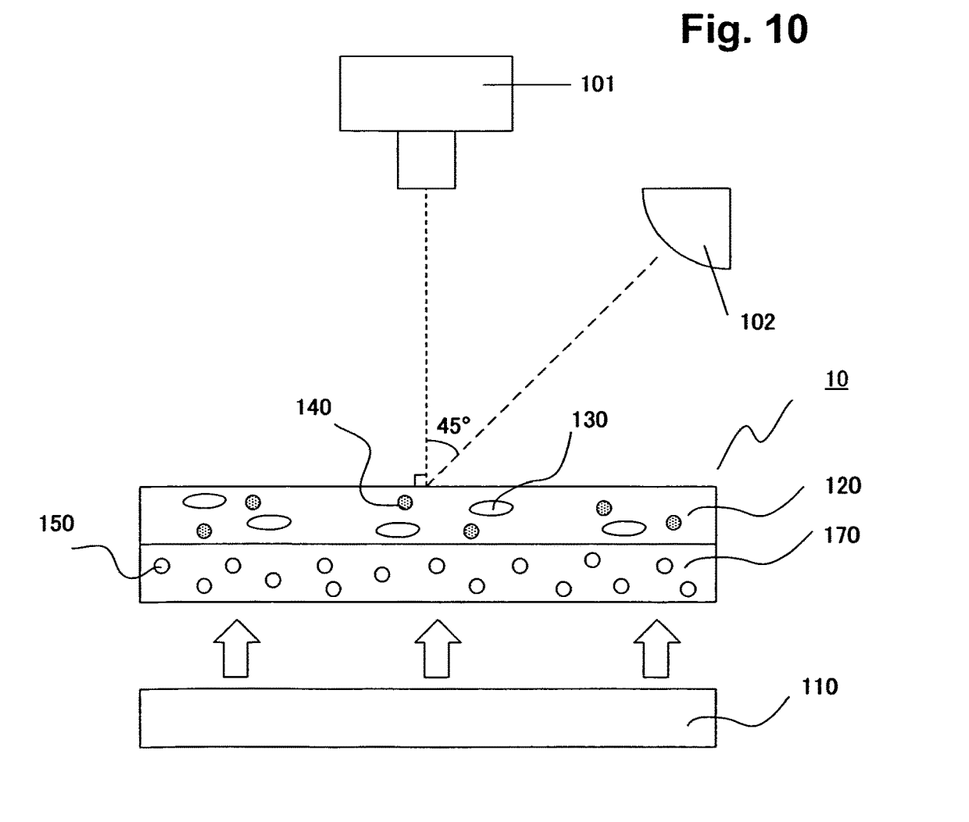
FIG. 10: shows a schematic of measurement construction in working example 6.

The element 6 was placed over the 450 nm LED light source so that the light scattering layer of the element 6 was faced to the 450 nm LED light source, and the green color converting layer was faced the National PRF-100W light source. National PRF-100 W light source was placed 30 cm upper from the surface of the element 6, in the direction of the 45° from the orthogonal axis to the surface of the green color converting layer of the element 6. Then, CS-1000A set in the direction orthogonal to the surface of the green color converting layer of the element 6. A schematic of the configuration of this measurement is shown in FIG. 10. For the measurement of the brightness contrast of the element under the incident light, first, the 450 nm LED light source was illuminated with the condition of Lv=2896.18 cd/m$^2$. Then the LED light was turned off to measure the brightness contrast of the element under the incident light. During the measurement, the National PRF-100W light source as an incident light source was illuminated.

<6-2>

The element 6 was placed over the 450 nm LED light source so that the green color converting layer of the element 6 was faced to the 450 nm LED light source, and the light scattering layer was faced the National PRF-100W light source. National PRF-100 W light source was placed 30 cm upper from the surface of the element 6, in the direction of the 45° from the orthogonal axis to the surface of the light scattering layer of the element 6. And in the same condition mentioned in above <6-2>, the brightness contrast under the incident light of the element 6 was measured.

The table 2 shows the obtained results.

TABLE 2

| | 450 nm LED | Lv (cd/m$^2$) | Light Intensity (W/sr/cm$^2$/nm) at 525 nm | x | y | ⊿xy | Contrast (On/Off) |
|---|---|---|---|---|---|---|---|
| <6-1> | ON | 720.9 | 0.024 | 0.278 | 0.679 | 0.01 | 7.16 |
| | OFF | 100.7 | 0.003 | 0.337 | 0.620 | 0.07 | |
| <6-2> | ON | 1223.8 | 0.033 | 0.349 | 0.548 | 0.16 | 2.43 |
| | OFF | 504.6 | 0.006 | 0.428 | 0.418 | 0.16 | |
| No scattering layer (Reference) | ON | — | — | 0.267 | 0.684 | — | — |
| | OFF | — | — | 0.367 | 0.562 | — | |

Color Shift ∠xy in the table 2 was calculated with following formula 1;

$$\angle xy = \sqrt{((x_E - x_R)^2 + (y_E - y_R)^2)} \quad \text{formula 1}$$

(Wherein the formula 1, symbol "$x_E$" represents x value of the each example in chromaticity coordinate and "$x_R$" represents x value of the reference; "$y_E$" represents y value of the each example and "$y_R$" represents y value of the reference.)

As shown in Table 2, the brightness contrast under the incident light of the element 6 (<6-1>) in which the light scattering layer of the element 6 was placed behind the green light converting layer viewed from the light source was 2.95 times higher than the brightness contrast of the element 6 (<6-2>) in which the light scattering layer of the element 6 was placed in the incident light source side.

Furthermore, it is clearly shown in table 2 that the color shift of <6-1> was significantly smaller than the color shift of <6-2>.

Working Example 7: Fabrication of an Element and Measurement of Thereof 1.0 g of polyvinyl cinnamate (Sigma-Aldrich) and 0.02 g of red pigment diketo-pyrrolo-pyrrole (Irgaphor red B CF), and 0.2 g of red quantum rods (from Qlight Nanotech, peak wavelength of the light emission; 631 nm) were dispersed in toluene (2 g) and stirred for 5 minutes at 90° C. in air condition.

The diameter and the length of each quantum rod measured with using TEM (Transmission Electron Microscope; TEM) were 6 nm and 27 nm respectively.

A glass substrate was cleaned by sonicating in acetone. Then the resulting solution was coated onto the cleaned glass substrate with using Doctor Blade technique to fabricate light converting layer having 10 μm thickness. The resulting substrate was heated at 100° C. for 3 minutes at air condition to evaporate the solvent.

After the heating, the substrate was exposed to 254 nm UV light (2.3 mW/cm$^2$) for 3 minutes under nitrogen flowing condition.

Then, the red color converting layer was rinsed with toluene for one minutes and heated for 3 minutes at 100° C.

Finally, the red color converting layer fabricated onto the substrate was obtained.

The light scattering layer was fabricated in the same manner as described in working example 6 and obtained element 7 was measured in the same manner as described in working example 6.

TABLE 3

| | 450 nm LED | Lv (cd/m$^2$) | Light Intensity (W/sr/cm$^2$/nm) at 630 nm | x | y | $\Delta$xy | Contrast (On/Off) |
|---|---|---|---|---|---|---|---|
| <7-1> | ON | 1253.5 | 0.087 | 0.210 | 0.067 | 0.01 | 5.29 |
| | OFF | 236.9 | 0.015 | 0.621 | 0.353 | 0.01 | |
| <7-2> | ON | 1578.3 | 0.097 | 0.232 | 0.092 | 0.05 | 2.74 |
| | OFF | 576.1 | 0.014 | 0.463 | 0.399 | 0.2 | |
| No scattering layer (Reference) | ON | — | — | 0.199 | 0.059 | — | — |
| | OFF | — | — | 0.616 | 0.355 | — | |

As shown in Table 3, the brightness contrast under the incident light of the element 6 (<7-1>) in which the light scattering layer of the element 7 was placed in the back light source side (opposite side from the incident light source via the green color converting layer) was 1.93 times higher than the brightness contrast of the element 7 (<7-2>) in which the light scattering layer of the element 7 was placed in the incident light source side.

Furthermore, it is clearly shown in table 3 that the color shift of <7-1> was smaller than the color shift of <7-2>.

The invention claimed is:

1. An electro optical switching element (100), comprising at least one light source (110), and a light converting layer (120), wherein the light converting layer (120) has been made from at least a light converting material (130), a coloring agent (140), and a matrix material, wherein the light converting material (130) is capable of converting light of the wavelength of the light source (110) into longer light wavelength, and the coloring agent (140) is capable of absorbing a visible light, wherein the coloring agent (140) is a dye, pigment or a combination thereof, wherein the electro optical switching element (100) comprises a plurality of light scattering particles (150).

2. The electro optical switching element (100) according to claim 1, which further comprises a light modulator (160).

3. The electro optical switching element (100) according to claim 1, which comprises a light scattering layer (170) including the plurality of light scattering particles (150).

4. The electro optical switching element (100) according to claim 3, wherein the light source (110), the light scattering layer (170), and the light converting layer (120), are placed in this sequence.

5. The electro optical switching element (100) according to claim 1, wherein the light converting layer (120) comprises the plurality of light scattering particles (150).

6. The electro optical switching element (100) according to claim 2, wherein the light modulator (160) is placed at the light extraction side of the light converting layer (120).

7. The electro optical switching element (100) according to claim 2, wherein the light modulator (160) is placed in between the light source (110) and the light converting layer (120).

8. The electro optical switching element (100) according to claim 1, wherein the surface of the light extraction side of the light converting layer (120) is structured.

9. The electro optical switching element (100) according to claim 1, which further comprises a layer (180) whose surface of the light extraction side is structured.

10. The electro optical switching element (100) according to claim 1, wherein the light source (110) is switchable.

11. The electro optical switching element (100) according to claim 1, wherein the light converting material (130) of the light converting layer (120) is selected from the group consisting of an organic fluorescent material, organic phosphorescent material, phosphor material, quantum sized inorganic semiconductor material or a combination thereof.

12. The electro optical switching element (100) according to claim 1, which further comprises a selective light reflection layer (190) placed in between the light source (110) and the light converting layer (120).

13. The electro optical switching element (100) according to claim 1, wherein the light converting layer (120) comprises a first and second sub color areas (200), in which at least a first sub color area emits light having longer peak wavelength than second sub color areas when it is illuminated by the light source.

14. The electro optical switching element (100) according to claim 1, which is in an optical device.

15. An optical device (210), including the electro optical switching element (100) comprising at least one light source (110), and a light converting layer (120), wherein the light converting layer (120) has been made from at least a light converting material (130), a coloring agent (140), and a matrix material, wherein the light converting material (130) is capable of converting light wavelength of the light from the light source (110) into longer light wavelength, and a coloring agent (140) is capable of absorbing a visible light, wherein the coloring agent (140) a dye, pigment or a combination thereof, wherein the electro optical switching element (100) comprises a plurality of light scattering particles (150).

16. The electro optical switching element (100) according to claim 1, wherein the matrix material is a transparent matrix material.

17. The electro optical switching element (100) according to claim 1, which is polarized, and which further comprises a black matrix.

* * * * *